(12) United States Patent
Ertel et al.

(10) Patent No.: US 9,959,673 B2
(45) Date of Patent: May 1, 2018

(54) IMAGE QUALITY OF A MAGNETIC RESONANCE IMAGE DATASET

(71) Applicants: Dirk Ertel, Neunkirchen am Brand (DE); Yiannis Kyriakou, Spardorf (DE)

(72) Inventors: Dirk Ertel, Neunkirchen am Brand (DE); Yiannis Kyriakou, Spardorf (DE)

(73) Assignee: Siemens Aktiengesellschaft, München (DE)

( * ) Notice: Subject to any disclaimer, the term of this patent is extended or adjusted under 35 U.S.C. 154(b) by 286 days.

(21) Appl. No.: 14/996,740

(22) Filed: Jan. 15, 2016

(65) Prior Publication Data

US 2016/0217555 A1    Jul. 28, 2016

(30) Foreign Application Priority Data

Jan. 22, 2015   (DE) .................. 10 2015 201 057

(51) Int. Cl.
*G06T 7/00*     (2017.01)
*G06T 19/00*    (2011.01)
(Continued)

(52) U.S. Cl.
CPC ............ *G06T 19/00* (2013.01); *G01R 33/565* (2013.01); *G01R 33/5608* (2013.01); *G01R 33/4812* (2013.01)

(58) Field of Classification Search
CPC .. G06T 19/00; G01R 33/5608; G01R 33/565; G01R 33/4812
See application file for complete search history.

(56) References Cited

U.S. PATENT DOCUMENTS

2003/0139659 A1   7/2003  Dale et al.
2006/0058641 A1   3/2006  Krieg et al.
(Continued)

FOREIGN PATENT DOCUMENTS

DE   102004043889 A1   3/2006
DE   102006001681 A1   7/2007

OTHER PUBLICATIONS

German office Action for related German Application No. 10 2015 201 057.0 dated Jun. 27, 2016, with English Translation.

*Primary Examiner* — Kim Vu
*Assistant Examiner* — Molly Delaney

(57) ABSTRACT

A method for improving the image quality of a three-dimensional magnetic resonance image dataset recorded with a magnetic resonance device, wherein, from at least one correction image dataset recorded with a modality other than magnetic resonance imaging, registered with the magnetic resonance image dataset, showing at least partly the same recording region as the magnetic resonance image dataset, especially an x-ray image dataset, relevant material parameters are derived locally-resolved for the magnetic resonance imaging, which are used for establishing a virtual magnetic resonance comparison dataset in a simulation wherein, as a function of a comparison between the magnetic resonance image dataset and the magnetic resonance comparison dataset, at least one measure parameter describing an image quality improvement measure to be applied in the k-space is determined and the image quality improvement measure is carried out with the measure parameter relating to the magnetic resonance image dataset.

21 Claims, 2 Drawing Sheets

(51) Int. Cl.
*G01R 33/56* (2006.01)
*G01R 33/565* (2006.01)
*G01R 33/48* (2006.01)

(56) References Cited

U.S. PATENT DOCUMENTS

2008/0319308 A1* 12/2008 Tang ................. A61B 5/055
                                              600/416
2010/0166273 A1   7/2010 Wismuller
2013/0218002 A1*  8/2013 Kiraly ............... G01R 33/4814
                                              600/411

* cited by examiner

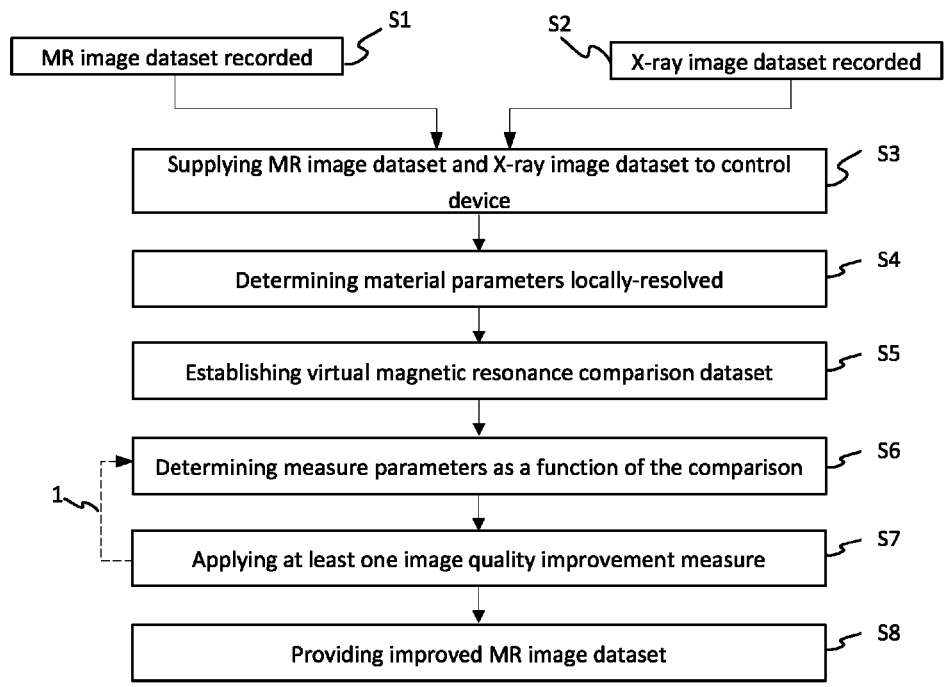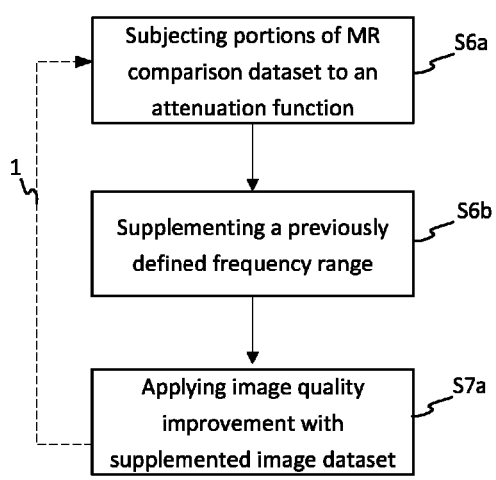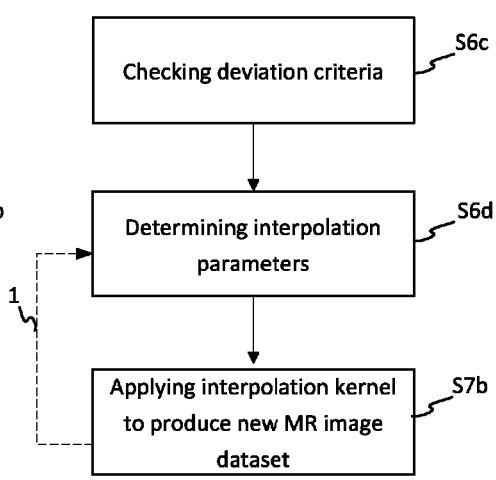

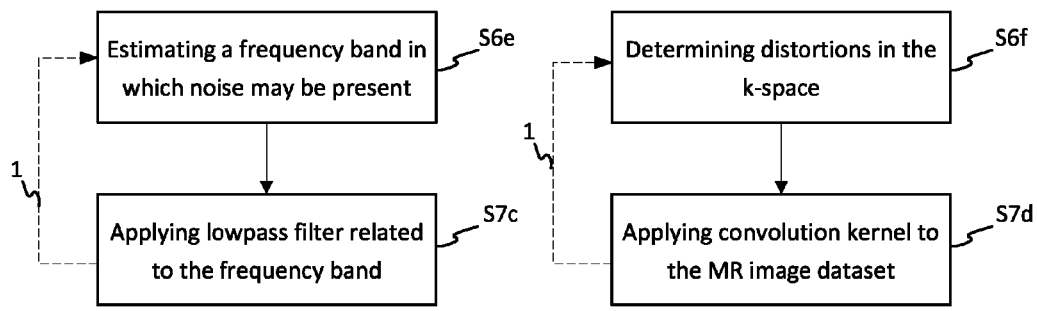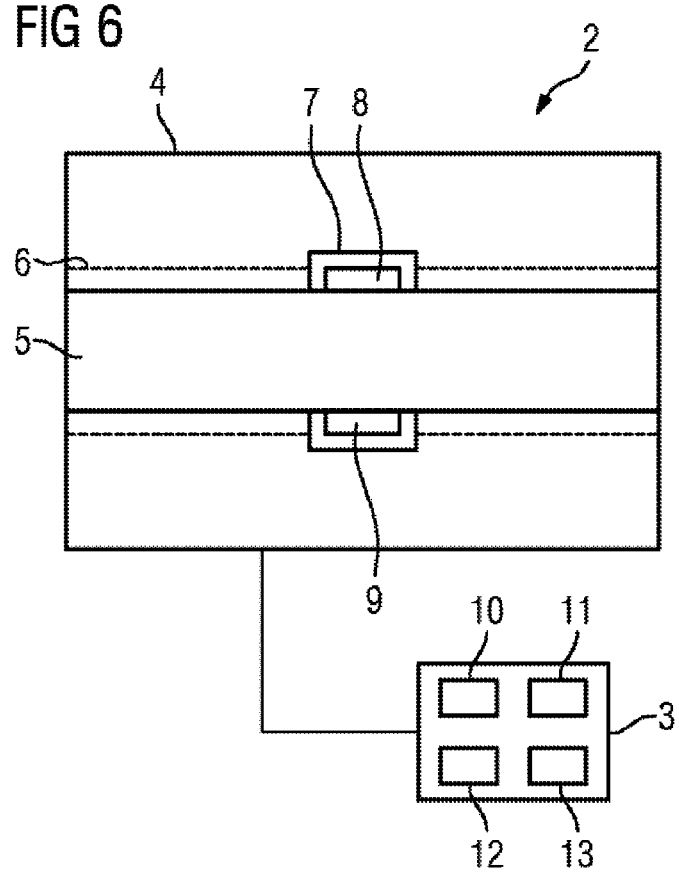

IMAGE QUALITY OF A MAGNETIC RESONANCE IMAGE DATASET

This application claims the benefit of DE 10 2015 201 057.0, filed on Jan. 22, 2015, which is hereby incorporated by reference in its entirety.

TECHNICAL FIELD

The embodiments relate to a method for improving the image quality of a three-dimensional magnetic resonance image dataset recorded with a magnetic resonance device, a computing device, and a computer program.

BACKGROUND

Magnetic resonance imaging has become established as a modality for the examination of patients in medical devices, since it provides a number of advantages, such as the outstanding soft tissue contrast of magnetic resonance imaging. There are limitations in relation to magnetic resonance imaging, however, which to some extent are inherent, but are also caused to some extent by the specific circumstances for recording a magnetic resonance image dataset. These limitations are at the expense of the image quality of the magnetic resonance image dataset. For example, recordings with high local resolution mostly take longer, so that movements may occur in the recording region. Approaches for shortening the measurement times for magnetic resonance image datasets are, for example, an undersampling of areas of the k-space, which may likewise lead to limitations in the image quality. A further problem limiting the image quality of the magnetic resonance imaging is the homogeneity of the magnetic resonance fields used, wherein even small deviations from this homogeneity may manifest themselves in limitations in the image quality.

To compensate for these limitations, the use of combination imaging devices, which combine a magnetic resonance device and an imaging device of a further modality, (e.g., an x-ray device), has been proposed. For example, combined magnetic resonance/x-ray imaging devices have been proposed, in which a recording arrangement of an x-ray device with x-ray source and x-ray detector have been integrated mechanically into the patient support of a magnetic resonance device. In this way, it is made possible to record magnetic resonance image datasets and x-ray image datasets at the same time.

The problem that arises in such cases, however, is that the two imaging modalities are realized as a separate imaging chain. Limitations of one modality, of the magnetic resonance imaging, for example, are only compensated for by image datasets of the other modality, which may not have these limitations, being able to be provided simultaneously.

A further overall improvement in the quality of magnetic resonance image datasets, which goes beyond hitherto existing approaches, (e.g., filter algorithms for reducing artifacts), may be desirable, and which may also provide magnetic resonance image datasets with image characteristics that, despite the limitations of magnetic resonance imaging, correspond to those of other modalities or at least approach said modalities.

SUMMARY AND DESCRIPTION

The scope of the present invention is defined solely by the appended claims and is not affected to any degree by the statements within this summary. The present embodiments may obviate one or more of the drawbacks or limitations in the related art.

An underlying object of the embodiments is to specify a possibility for improving the image quality of magnetic resonance datasets in respect of limitations when compared to other modalities, such as x-ray imaging.

To achieve this object, a method is provided for material parameters relevant for magnetic resonance imaging to be derived locally-resolved from at least one correction image dataset, (e.g., an x-ray image dataset), recorded with a modality other than magnetic resonance imaging, registered with the magnetic resonance image dataset, showing at least partly the same recording region as the magnetic resonance image dataset, which are used to establish a virtual magnetic resonance comparison dataset in a simulation wherein, depending on a comparison of the magnetic resonance image dataset with the magnetic resonance comparison dataset, at least one measure parameter describing a quality improvement measure to be applied in the k-space is determined and the image quality improvement measure is carried out with the measure parameter relating to the magnetic resonance image dataset.

In one embodiment, an iterative image quality improvement method for magnetic resonance imaging is provided, which is applied in the k-space and uses correction image datasets of another modality, (e.g., x-ray image datasets), in order to optimize the image quality of magnetic resonance image datasets. Thus, the information that was obtained by another imaging modality is ultimately used to be able to compensate at least partly for limitations in the magnetic resonance imaging. Use is made of the fact that the correction image datasets contain information about the materials in the recording area, so that these are able to be classified with respect to the magnetic resonance imaging, thus are able to be described in their magnetic characteristics, which in turn makes it possible to estimate that result the magnetic resonance imaging may have produced under idealized conditions. This result is created in the form of the virtual magnetic resonance comparison dataset, which ultimately represents a kind of orientation point that may show where and/or how corrections are to be made to the magnetic resonance image dataset in order to improve the image quality with respect to limitations in the magnetic resonance imaging that are not available with the other modality. Thus, the comparison of the magnetic resonance image dataset and the magnetic resonance comparison dataset, which may also be carried out at least partly in the k-space, as will be discussed in greater detail below, makes it possible to determine measure parameters, (e.g., filter parameters, interpolation parameters, distortion removal parameters, and the like), in order to carry out concrete image quality improvement measures. These are applied in the k-space, since inadequacies or limitations in the magnetic resonance imaging originally occur precisely at this location in the magnetic resonance image data and are sharply localized. This localization may, however, be lost in the local space, so that the method expediently starts to correct directly in the k-space.

Overall, it is possible, using the method, to greatly expand the applicability of magnetic resonance imaging in the medical environment. It is advantageous if the correction image dataset is recorded with the same imaging device as the magnetic resonance image dataset, which is a combination-imaging device. A combination-imaging device, which may contain a magnetic resonance device and an x-ray device, advantageously makes it possible to record basically registered magnetic resonance image datasets and correction image datasets at a small distance in time and space, so that an extremely reliable basis for the comparison is produced. Use of the present embodiments is appropriate in angiography magnetic resonance/x-ray combination imaging devices, since a marked improvement of the magnetic resonance image quality is made possible, (e.g., in combined recordings of digital subtraction angiography and time-of-flight magnetic resonance angiography), wherein it is pointed out in particular that material characteristics may also be derived from mask images or from filling images of x-ray imaging not yet subjected to subtraction, since these naturally still contain the anatomy.

It is sensible with respect to the comparison to undertake a normalization of the magnetic resonance image data and the magnetic resonance comparison data, thus to employ an adequate signal normalization for the magnetic resonance image dataset and the magnetic resonance comparison dataset, in order to improve the stability of the method presented here and make a meaningful comparison possible.

To establish the material parameters a material and/or a material compound may be established for each image element of the correction image dataset and/or the proton densities and/or at least one relaxation constant and/or spin characteristics may be used as material parameters. Deriving material characteristics from image datasets, (e.g., x-ray image datasets), is already fundamentally known in the prior art, wherein automatic image processing techniques may be employed, (e.g., threshold value-based segmentations and the like). This allows a classification of the contents of individual image elements, thus of voxels for three-dimensional correction image datasets, wherein the respective identified or recorded materials or material compounds, (e.g., water, fat, and the like), may be assigned characteristics relevant for magnetic resonance imaging, (e.g., the proton density, relaxation constants, and spin characteristics). The material parameters may be understood as a virtual, e.g., likewise three-dimensional, image element model or voxel model, in which material properties are thus assigned to the individual image elements. This virtual model may now be used to derive the magnetic resonance comparison dataset from said elements.

In this context, a useful development makes provision for a magnetization underlying the simulation to be established from the material parameters, using the Bloch equations. Thus, in one act, the virtual image element model given by the material parameters is used in order to calculate the local magnetization with the aid of the Bloch equations.

As part of the simulation, at least one recording parameter of the magnetic resonance image dataset and/or at least one operating parameter of the magnetic resonance device is taken into account, meaning that the fact is utilized that it is known for the magnetic resonance image dataset with which magnetic resonance device, using which recording parameters, it was recorded. The operating parameters describing the characteristics of the magnetic resonance device and the recording parameters used during the recording of the actual magnetic resonance image dataset are thus used to carry out the simulation. These parameters may, for example, involve the strength of the basic magnetic field, gradient fields used, the radio-frequency pulses used, and the like. For example, the imaging process itself may be simulated as part of the simulation, wherein the magnetic resonance comparison data in the k-space is obtained directly as a result. Simulation methods are also conceivable in which the magnetic resonance comparison dataset is obtained directly in the local space and only has to be transformed into the k-space by Fourier transformation, (which has already been explained), if the comparison is to be carried out at least partly in the k-space and/or magnetic resonance comparison data is needed for image improvement purposes in the k-space, a topic which is to be dealt with in more detail below.

It is expedient in this context for idealized recording conditions to be assumed for establishing the magnetic resonance comparison dataset. The magnetic resonance comparison dataset is intended to serve to compensate for limitations in the magnetic resonance imaging, which ultimately arise from there not being any ideal recording conditions during the recording of magnetic resonance image datasets or from said conditions not being possible at all, relating to the local resolution, measurement times, homogeneities, and the like, for example. In other words, the effects to be compensated for, which were present during the recording of the magnetic resonance image dataset, may be precisely excluded by the simulation, so that ultimately the simulation parameters, although they are predetermined in accordance with the actual recording conditions, are configured to such an extent that the magnetic resonance-specific artifacts or limitations are avoided. For example, it may be assumed for the simulation that a perfect homogeneity is present, no movements occur in the recording region during any given length of measurement time and the like.

Thus, a virtual, (e.g., three-dimensional), magnetic resonance comparison image dataset is produced, which was created on the basis of the, for example, three-dimensional correction image dataset, e.g., x-ray image dataset.

In this case, it is noted that the characteristics of the k-spaces of the magnetic resonance comparison dataset and of the magnetic resonance image dataset naturally do not absolutely have to correspond, but the characteristics of the associated k-space of the magnetic resonance comparison dataset are selected so that the desired image quality improvement is also made possible. In other words, there may be provision for a k-space having different characteristics from the k-space of the magnetic resonance image dataset to be used for the magnetic resonance comparison dataset, such as an expanded k-space having another Nyquist frequency is used for the magnetic resonance comparison dataset. Differences may naturally contain magnetic resonance comparison data beyond an expansion of the k-space, aimed at improving the local resolution for other k-space points not sampled in the magnetic resonance image dataset, for example, if an undersampling of the magnetic resonance image dataset was present in areas of the k-space and the like. The magnetic resonance comparison dataset may thus also provide magnetic resonance comparison data in areas of the k-space, which is not present in the magnetic resonance image dataset. Concrete examples of applications are discussed in greater detail below.

As has already been mentioned, advantageous embodiments make provision for measure parameters to be established iteratively in an optimization method, such as in an optimization method related to a minimization of the difference between the magnetic resonance image dataset and the magnetic resonance comparison dataset. With image quality improvement measures involving more complex, larger areas of magnetic resonance image data, (for example, with the use of convolution kernels and the like), an iterative establishment of measure parameters in an optimization method is thus conceivable, in order to be able to achieve the optimal image quality. But with this method, an iterative image quality improvement is ultimately present, because the comparison is made with regard to the magnetic resonance image dataset processed with the current measure parameters. In such cases, depending on embodiment and aspect to be improved in relation to the image quality, it may be expedient to restrict the comparison to specific frequency ranges or frequency bands, wherein such concrete approaches are discussed in greater detail below. Different optimization algorithms may be employed, such as Nelder-Mead algorithms, Lagrange algorithms, SQP algorithms, and the like. For an additional act of the iterative determination of the measure parameters, the optimization algorithm used to carry out the optimization method specifies which values are to be tested.

In one embodiment, there is provision for a measure parameter describing a frequency band containing noise to be established within the optimization method, wherein a lowpass filter related to the frequency band is employed as the image quality improvement measure. In this way, dedicated noise suppression within the magnetic resonance image data may be achieved. Via the comparison of the magnetic resonance image dataset with the magnetic resonance comparison dataset in the k-space the noise spectrum in the magnetic resonance image dataset may be estimated, (e.g., the frequency band), which contains the noise, may be determined. For different limits of this frequency band, wherein it may also be sufficient to fix a limit of the frequency band as the Nyquist frequency, the results of noise suppression are considered in the optimization method. Thus, in this case, the image quality improvement measure represents an optimal lowpass filtering for the actual magnetic resonance image dataset.

A concrete embodiment makes provision that, for a magnetic resonance comparison dataset containing points in the k-space not contained in the magnetic resonance image dataset, the magnetic resonance image dataset is supplemented as an image quality improvement measure by at least some of these points, wherein the measure parameters describe k-space areas in which the supplementation is to take place, and the comparison of the magnetic resonance image dataset with the magnetic resonance comparison dataset is carried out in the local space. The last-mentioned measure in this case is due to the fact that, for an addition, the distance between the datasets does actually remain unchanged. In this variant, the magnetic resonance image data contained in the magnetic resonance image dataset may ultimately be supplemented by further areas or points in the k-space, be it beyond the previous limitation frequency, in order to achieve a better local resolution, or to compensate for an undersampling or the like. Thus, in one of the variants, the ability to present detail, (e.g., the local resolution), may be improved within the magnetic resonance image data, by the high-frequency k-space of the magnetic resonance image data being filled up by the corresponding k-space points of the virtual magnetic resonance comparison dataset.

In this context, a further development makes provision, during a supplementing of non-covered frequency ranges above the Nyquist frequency of the magnetic resonance comparison dataset, for the portions of the magnetic resonance comparison dataset to be added to be multiplied beforehand by an attenuation function. In respect of applicability in the medical context, it may be expedient initially to process the magnetic resonance comparison data of the points to be supplemented in the k-space with an attenuation function, in order to continue to guarantee a characteristic magnetic resonance image impression. For example, there may be provision that a constant transition to zero is provided at higher frequencies.

A further advantageous concrete embodiment makes provision, as part of the comparison carried out in the k-space, for magnetic resonance image data to be identified for which there is a deviation of the magnetic resonance dataset from the magnetic resonance comparison image dataset fulfilling a deviation criterion present, wherein the identified magnetic resonance image data is corrected as a function of the corresponding magnetic resonance comparison data. In this case, individual points in the k-space do not have to be considered unconditionally only or in a basically allowed way, but it is entirely conceivable to discover k-space areas in which deviations are present. Thus, in this embodiment, the comparison takes place in the k-space. Through this, a specific image improvement in individual frequency ranges, under some circumstances also for individual k-space points, for reduction of artifacts, is allowed. Via the comparison, such as part of a differential calculation, of the two datasets, those k-space areas within the magnetic resonance image dataset that exhibit a signal deviation may be identified, wherein, for example, threshold value comparisons may be carried out. Magnetic resonance image data identified in this way as likely to be erroneous may be modified and/or replaced.

In certain embodiments, provision is made for the deviating magnetic resonance image data to be replaced by the corresponding magnetic resonance comparison data, wherein, however, an orientation to the actual measured magnetic resonance image data may be more appropriate.

Thus, an advantageous development makes provision for a measure parameter describing an interpolation kernel allowing the calculation of replacement data for the identified magnetic resonance image data from the magnetic resonance image data adjacent to the identified magnetic resonance image data, such as in the optimization method, to be established wherein, as an image quality improvement measure, the replacement data replaces the identified magnetic resonance image data. Thus, an interpolation kernel through which a part of the measure parameters are parameterized may be used to derive replacement data for deviating magnetic resonance image data from the adjacent magnetic resonance image data, which has actually been measured, so that ultimately only the form of the interpolation is influenced by the magnetic resonance comparison data. Frequently, it is not sufficient to simply employ a linear interpolation or one pre-specified in another fixed way. It is particularly appropriate for the measure parameters to be determined as part of the iterative optimization method already described, so that the optimal interpolation kernel may be identified. This optimal interpolation kernel is applied to the magnetic resonance image dataset in order to replace the deviating magnetic resonance data.

A further embodiment makes provision, in the comparison carried out in the k-space, for a measure parameter defining a convolution kernel describing a distortion in the k-space to be established, where the convolution kernel is applied to the magnetic resonance image dataset as an image quality improvement measure. In this way, magnetic-resonance-specific artifacts, which may be triggered by field inhomogeneities or magnetic susceptibilities, for example, are reduced, since these lead to a characteristic disturbance of the k-space. For example, corresponding disturbances that are present, (e.g., inhomogeneities), distort the k-space. This characteristic distortion for a magnetic resonance image dataset may be identified by comparison with the magnetic resonance comparison dataset created for idealized conditions, so that an optimal convolution kernel may also be identified, such as in the described optimization method. Via this convolution kernel a corresponding distortion may be realized, so that the convolution kernel is ultimately applied to the magnetic resonance image dataset in order to correct the k-space. Finally, in such cases, a displacement of k-space points is corrected by corresponding reverse displacement.

The concrete options for image quality improvement measures described here may naturally be combined with one another or with further image quality improvement measures not described here.

A useful variant makes provision for the establishment of the measure parameters and the carrying out of the image quality improvement measures to only be carried out on a target portion of the magnetic resonance image dataset able to be selected by a user and/or determined automatically. Thus, specific image areas in the local space of the corresponding image data are able to be predetermined, which may either recognize the defined structures in the magnetic resonance image data automatically, (e.g., by an image processing algorithm), or may also be done by a user by manual marking. If, for example, a rectangular or square target portion is determined automatically or defined manually, this is mapped in the k-space in the form of Sinc functions, which also allow a restriction of the magnetic resonance image data and magnetic resonance comparison data to be considered there. With such a restriction to a target portion, ultimately the same image quality improvement acts as already presented are carried out, but are merely applied within one k-space, which corresponds to the specific image area in the local space described by the target portion.

A three-dimensional correction image dataset may be used in order to obtain the maximum benefit from the image improvement measures. It is also conceivable, however, to use two-dimensional correction image datasets, wherein provision may be made for example for a two-dimensional projection image dataset to be used as the correction image dataset, wherein, to make the comparison, an integration comparison dataset integrated up in the projection directions according to the recording geometry of the projection image dataset is established as the magnetic resonance comparison dataset and is compared with an integration image dataset accordingly established from the magnetic resonance image dataset. Thus, using the corresponding simulation environment, a virtual magnetic resonance comparison dataset may also be established in the k-space from a two-dimensional projection image dataset, for example, an x-ray projection image dataset. In order to guarantee an appropriate correspondence between the magnetic resonance image data and the virtual magnetic resonance comparison data, the k-space of the magnetic resonance image data is integrated in accordance with the recording geometry, thus with the projection directions of the two-dimensional projection image dataset. Thus, the projection of the magnetic resonance image data is ultimately undertaken for example in accordance with the cone beam geometry of an x-ray device used. The magnetic resonance comparison data is projected in the same way. This makes possible a three-dimensional comparison. Despite this measure parameters for the three-dimensional magnetic resonance image data are also able to be established in this context, at least when, as described, an iterative optimization method is used, within which the correct distributions for the integrated values are set in the three-dimensional k-space.

As well as the method, one embodiment relates to a computing device, (e.g., a control device of a combination imaging device for magnetic resonance imaging and at least one further modality), which is embodied for carrying out the method. Everything that has been stated in relation to the method may be transferred analogously to the computing device, with which the advantages already mentioned may thus be obtained. In particular, the computing device may thus have a material parameter establishing unit for establishing the material parameters, a simulation unit for establishing the virtual magnetic resonance comparison dataset, a measure parameter determination unit for determining the optimal measure parameters and an image quality improvement unit for carrying out the image quality improvement measures. Expediently, a control device of a combination-imaging device may be accordingly embodied so that, in a combined evaluation of image datasets of the different modalities recorded simultaneously or close to each other in time, the image quality improvement of the magnetic resonance image dataset may be undertaken immediately based on the correction image dataset. This may involve a magnetic resonance/x-ray combination-imaging device, which maybe embodied for angiographic imaging.

Finally, the embodiments also relate to a computer program, which carries out the method acts when the computer program is executed on a computing device. What has been stated above also applies to the computer program; it may be stored for example on a non-transient data medium, for example a CD-ROM.

BRIEF DESCRIPTION OF THE DRAWINGS

Further advantages and details emerge from the exemplary embodiments described below and also with reference to the drawings, in which:

FIG. 1 depicts a flowchart of an exemplary embodiment of the method.

FIG. 2 depicts a flowchart for a first exemplary embodiment of improving image quality.

FIG. 3 depicts a flowchart for a second exemplary embodiment of improving image quality.

FIG. 4 depicts a flowchart for a third exemplary embodiment of improving image quality.

FIG. 5 depicts a flowchart for a fourth exemplary embodiment of improving image quality.

FIG. 6 depicts an example of a combination-imaging device.

DETAILED DESCRIPTION

FIG. 1 depicts a flowchart of an exemplary embodiment of the method, as may be carried out on a combination imaging device that combines a magnetic resonance device and an x-ray device. The combination imaging device allows simultaneous recording of magnetic resonance image datasets and x-ray image datasets, wherein, in the method presented in more detail here, a three-dimensional x-ray image dataset is used for improving the image quality of a three-dimensional magnetic resonance image dataset, for example, as part of angiographic examinations.

Thus, in corresponding acts S1 and S2, the magnetic resonance image dataset and the x-ray image dataset are recorded with the combination-imaging device and are then supplied to a control device of the combination-imaging device for joint processing, act S3. There, the x-ray image dataset, which in this exemplary embodiment represents the correction image dataset, is now initially used, in act S4, in order, at least for the recording region of the magnetic resonance image dataset also contained in the x-ray image dataset, to determine material parameters locally-resolved. For this purpose, in act S4, classification algorithms are used, which may be based on a threshold-based segmentation, and which assign materials or material compounds to the individual voxels as image elements. These materials or material compounds, in their turn, are assigned proton densities, relaxation constants, and spin characteristics as the material parameters.

In act S5, a virtual magnetic resonance comparison dataset is now established by simulation, using these material parameters. To do this, the material parameters are used as the basis of the simulation, in order to compute, using the Bloch equations, a simulation of the magnetizations in the recording region (and possibly also around said region) underlying the magnetic resonance imaging. Since the recording parameters of the magnetic resonance image dataset and the operating parameters of the magnetic resonance device as part of the combination imaging device are known, these may also be included in the simulation of a magnetic resonance measurement process that now follows, which in the exemplary embodiment presented here, directly delivers the magnetic resonance comparison dataset in the k-space. In this case, the conditions during the recording of the magnetic resonance image dataset are not completely mapped, however, but idealized, such as with respect to the homogeneity of the magnetic fields used and the sampling, for which measurement times of virtually any given length exist. It is also idealized with respect to the absence of movements in the recording region. Operating or recording parameters may for example include the main magnet field strength, gradient fields used, radio-frequency excitations, and the like.

Simulation methods able to be employed here have already been discussed for other purposes in the prior art.

In act S6, measure parameters are determined as a function of a comparison between the magnetic resonance image dataset and the magnetic resonance comparison dataset, which describe the concrete form of at least one image quality improvement measure, which is applied in act S7 to the magnetic resonance image dataset or is employed respectively for a number of image quality improvement measures. Acts S6 and S7 may be carried out separately in each case for different image quality improvement measures, in many cases it is also possible, however, to determine measure parameters of different image quality improvement measures simultaneously, such as if there is an underlying corresponding comparison in each case, for example, a comparison in the k-space. It may also be possible to establish the measure parameters iteratively in an optimization method, which is indicated by the dashed-line arrow 1. This may also be done for just some of the image quality improvement measures, if a number of measures are provided.

The method ends in act S8 with a magnetic resonance image dataset improved as regards its image quality, using the x-ray image dataset.

Concrete variants or possibilities for image improvement measures, which are of course all able to be combined with one another, will now be presented below.

FIG. 2 depicts a flowchart for when the local resolution of the magnetic resonance image dataset is to be improved. In this case, the magnetic resonance comparison dataset has been determined so that it also contains k-space points in high-frequency areas of the k-space, which are initially subjected in act S6a to an attenuation function, which is described by corresponding attenuation parameters, which may provide a constant transition to zero at high frequencies. In act S6b, an initial frequency range or a frequency range to be currently used as from the previous limit frequency of the magnetic resonance image dataset is defined, in which the supplementing is to be undertaken. This frequency range to be supplemented, which was previously not covered by the magnetic resonance image data, and/or the attenuation parameters of the attenuation function, are in this case the measure parameters that may be predetermined or may be determined once, so that in act S7a, the carrying out of the image quality improvement measure may also have been concluded with the corresponding supplementing of the magnetic resonance image dataset. It is also conceivable, as regards these measure parameters, also to undertake the already described iterative optimization according to arrow 1.

FIG. 3 involves a further possibility, which relates to the specific correction of individual frequency ranges. In this case, first of all, in act S6c, deviation criteria are checked as part of the comparison, wherein, if deviation criteria for k-space points are fulfilled (e.g., the comparison is carried out in the k-space) areas of the k-space are identified in which the deviations between the magnetic resonance image data and the magnetic resonance comparison data are too great. The magnetic resonance image data deviating widely in this way is to be replaced by replacement data, in the present case by data, which is to be determined by application of an interpolation kernel to the magnetic resonance image data not fulfilling the deviation criterion adjacent to the magnetic resonance image data fulfilling the deviation criterion. The interpolation parameters of this interpolation kernel represent the measure parameters, which are determined iteratively in the present case in the optimization method, thus in act S6d are predetermined for the next iteration act, so that in act S7b the interpolation kernel may be applied and a new magnetic resonance image dataset with replacement data is produced, which may again be evaluated in the comparison. If there is no abort criterion present the optimization method is continued. In this way, optimized interpolation kernels for deviating k-space areas are determined and thus optimal replacement data established.

FIG. 4 depicts image quality improvement measures for dedicated noise suppression within the magnetic resonance image data. In comparison act S6e, in this case the frequency band is estimated in which noise may be present, wherein in act S7c, a lowpass filter related to this frequency band is applied to this magnetic resonance image dataset. This method too is carried out in an iteratively optimizing manner in the measure parameters describing the frequency band.

FIG. 5 depicts a fourth example for concrete image quality improvement measures, wherein distortions in the k-space are determined as part of the comparison there in act S6f, which lead to predetermination of convolution parameters of a convolution kernel as measure parameters. This convolution kernel is applied in act S7d to the magnetic resonance image dataset in order to remove distortion from the k-space. The convolution parameters too may be continuously improved iteratively in the optimization method, until the optimal convolution kernel is found. Thus artifacts, which arise from field inhomogeneities/magnetic susceptibilities for example, may be corrected.

FIG. 6 depicts a basic outline diagram of a combination imaging device 2, the control device 3 of which is embodied for carrying out the method. A basic magnetic field unit 4 of a magnetic resonance device contained therein defines the patient receiving area 5. Surrounding this, as is basically known, coil arrangements 6 are provided, e.g., a gradient coil arrangement and a radio-frequency coil arrangement. These are interrupted centrally, however, in order to create space for an integrated gantry 7 of an x-ray device, in which a recording arrangement including x-ray source 8 and x-ray detector 9, which lie opposite one another, may be rotated around the patient.

The control device 3 is embodied for carrying out the method, for which purpose it accordingly contains, as already described, a material parameter establishment unit 10, a simulation unit 11, a measure parameter determination unit 12, and an image quality improvement unit 13.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for improving an image quality of a three-dimensional magnetic resonance image dataset recorded with a magnetic resonance device, the method comprising:
    deriving material parameters locally-resolved for a magnetic resonance device from at least one correction image dataset recorded with a modality other than the magnetic resonance device, registered with the magnetic resonance image dataset, showing at least partly a same recording region as the magnetic resonance image dataset;
    establishing a virtual magnetic resonance comparison dataset in a simulation using the material parameters;
    determining, as a function of a comparison between the magnetic resonance image dataset and the virtual magnetic resonance comparison dataset, at least one measure parameter describing an image quality improvement measure to be applied in a k-space; and
    applying the image quality improvement measure with the at least one measure parameter relating to the magnetic resonance image dataset.

2. The method of claim 1, wherein the at least one correction image dataset is an x-ray image dataset.

3. The method of claim 1, wherein the correction image dataset is recorded with a same image recording device as the magnetic resonance image dataset.

4. The method of claim 1, wherein, to establish the material parameters, a material or material compound is established for each image element of the correction image dataset, and/or
    one or more of proton densities, at least one relaxation constant, or spin characteristics are used as the material parameters.

5. The method of claim 1, wherein a magnetization underlying the simulation is established from the material parameters using Bloch equations.

6. The method of claim 1, wherein at least one recording parameter of the magnetic resonance image dataset, at least one operating parameter of the magnetic resonance device, or the at least one recording parameter and the at least one operating parameter are taken into account as part of the simulation, and/or
    wherein idealized recording conditions are used to establish the magnetic resonance comparison dataset.

7. The method of claim 1, wherein a k-space having different characteristics to the k-space of the magnetic resonance image dataset is used for the magnetic resonance comparison dataset.

8. The method of claim 7, wherein the k-space having the different characteristics is an expanded k-space having another Nyquist frequency.

9. The method of claim 1, wherein the measure parameters are established iteratively in an optimization method.

10. The method of claim 9, wherein the optimization method is related to a minimization of a difference between the magnetic resonance image dataset and the magnetic resonance comparison dataset.

11. The method of claim 9, wherein a measure parameter describing a frequency band containing noise is established within the optimization method, wherein a lowpass filter related to the frequency band is applied as the image quality improvement measure.

12. The method of claim 1, wherein, when the magnetic resonance comparison dataset includes points in the k-space not contained in the magnetic resonance image dataset, the magnetic resonance image dataset is supplemented as the image quality improvement measure by at least a part of these points, and
    wherein the measure parameters describe k-space areas in which the supplementing is to be done, and the comparison is carried out in a local space.

13. The method of claim 12, wherein, for frequency ranges above a Nyquist frequency of the magnetic resonance image dataset not covered by the supplementation, portions of the magnetic resonance comparison dataset to be added are multiplied beforehand by an attenuation function.

14. The method of claim 1, wherein magnetic resonance image data for which there is a deviation of the magnetic resonance image dataset from the magnetic resonance comparison dataset fulfilling a deviation criterion is identified as part of the comparison carried out in the k-space,
    wherein the identified magnetic resonance image data is corrected as a function of the corresponding magnetic resonance comparison data.

15. The method of claim 14, wherein a measure parameter describing an interpolation kernel allowing a calculation of replacement data for the identified magnetic resonance image data from the magnetic resonance image data adjacent to the identified magnetic resonance image data is established, and
    wherein, as the image quality improvement measure, the replacement data replaces the identified magnetic resonance image data.

16. The method of claim 15, wherein the measure parameter describing the interpolation kernel is established in an optimization method.

17. The method of claim 1, wherein, in the comparison carried out in the k-space, a measure parameter defining a convolution kernel describing a distortion in the k-space is established, and
    wherein, as the image quality improvement measure, the convolution kernel is applied to the magnetic resonance image dataset.

18. The method of claim 1, wherein the at least one measure parameter is only established and the image quality improvement measures are only carried out on a target portion of the magnetic resonance image dataset able to be selected by a user, determined automatically, or selected by the user and determined automatically.

19. The method of claim 1, wherein a two-dimensional projection image dataset is used as the correction image dataset, wherein, for carrying out the comparison, an integration comparison dataset integrated into projection directions according to a recording geometry of the projection image dataset is established as the magnetic resonance comparison dataset and is compared with an integration image dataset established from the magnetic resonance image dataset.

20. A computing device comprising:

a control device of a combination-imaging device for magnetic resonance imaging and for at least one further modality, wherein the computing device is configured to:
derive material parameters locally-resolved for a magnetic resonance device from at least one correction image dataset recorded with the at least one further modality, registered with a magnetic resonance image dataset, showing at least partly a same recording region as the magnetic resonance image dataset;
establish a virtual magnetic resonance comparison dataset in a simulation using the material parameters;
determining, as a function of a comparison between the magnetic resonance image dataset and the virtual magnetic resonance comparison dataset, at least one measure parameter describing an image quality improvement measure to be applied in a k-space; and
applying the image quality improvement measure with the at least one measure parameter relating to the magnetic resonance image dataset.

21. A non-transitory computer readable medium storing a computer program, with at least one processor, when executed on a computing device, cause the computing device to at least perform:
derive material parameters locally-resolved for a magnetic resonance device from at least one correction image dataset with at least one further modality, registered with a magnetic resonance image dataset, showing at least partly a same recording region as the magnetic resonance image dataset;
establish a virtual magnetic resonance comparison dataset in a simulation using the material parameters;
determining, as a function of a comparison between the magnetic resonance image dataset and the virtual magnetic resonance comparison dataset at least one measure parameter describing an image quality improvement measure to be applied in a k-space; and
applying the image quality improvement measure with the at least one measure parameter relating to the magnetic resonance image dataset.

* * * * *